(12) United States Patent
Albarede

(10) Patent No.: US 9,107,284 B2
(45) Date of Patent: Aug. 11, 2015

(54) CHAMBER MATCHING USING VOLTAGE CONTROL MODE

(71) Applicant: Lam Research Corporation, Fremont, CA (US)

(72) Inventor: Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 296 days.

(21) Appl. No.: 13/800,381

(22) Filed: Mar. 13, 2013

(65) Prior Publication Data

US 2014/0265833 A1 Sep. 18, 2014

(51) Int. Cl.
H05H 1/46 (2006.01)
H01J 37/32 (2006.01)

(52) U.S. Cl.
CPC ............ *H05H 1/46* (2013.01); *H01J 37/32183* (2013.01)

(58) Field of Classification Search
USPC .................................. 315/39, 111.21, 111.71
See application file for complete search history.

(56) References Cited

U.S. PATENT DOCUMENTS

| | | | |
|---|---|---|---|
| 4,377,961 A | 3/1983 | Bode | |
| 4,420,790 A | 12/1983 | Golke et al. | |
| 4,454,001 A | 6/1984 | Stemheim et al. | |
| 4,500,563 A | 2/1985 | Ellenberger et al. | |
| 5,474,648 A | 12/1995 | Patrick et al. | |
| 5,479,340 A | 12/1995 | Fox et al. | |
| 5,556,549 A | 9/1996 | Patrick et al. | |
| 5,689,215 A | 11/1997 | Richardson et al. | |
| 5,694,207 A | 12/1997 | Hung et al. | |
| 5,737,177 A | 4/1998 | Mett et al. | |
| 5,764,471 A | 6/1998 | Burkhart | |
| 5,788,801 A | 8/1998 | Barbee et al. | |
| 5,810,963 A | 9/1998 | Tomioka | |
| 5,812,361 A | 9/1998 | Jones et al. | |
| 5,866,985 A | 2/1999 | Coultas et al. | |

(Continued)

FOREIGN PATENT DOCUMENTS

| JP | 2001-127045 A | 5/2001 |
|---|---|---|
| JP | 2004239211 A | 8/2004 |

(Continued)

OTHER PUBLICATIONS

Thorsten, Lill et al., "Controlling ION Energy Within a Plasma Chamber", U.S. Appl. No. 13/930,138, filed Jun. 28, 2013.

(Continued)

*Primary Examiner* — Douglas W Owens
*Assistant Examiner* — Thai Pham
(74) *Attorney, Agent, or Firm* — Martine Penilla Group, LLP

(57) ABSTRACT

Systems and methods for compensating for harmonics produced during plasma processing in a plasma chamber are described. One of the methods includes retrieving a measurement of a combined waveform. The combined waveform includes a fundamental waveform and a harmonic waveform. The combined waveform defines a voltage proximate to a surface of a chuck, which is coupled to a radio frequency (RF) transmission line. The RF transmission line is coupled to an impedance matching circuit. The impedance matching circuit is coupled to an RF generator. The method further includes extracting the fundamental waveform from the combined waveform, determining a difference between a magnitude of the combined waveform and a magnitude of the fundamental waveform, and controlling the RF generator to compensate for the difference.

23 Claims, 6 Drawing Sheets

(56) References Cited

U.S. PATENT DOCUMENTS

| | | | |
|---|---|---|---|
| 5,889,252 A | 3/1999 | Williams et al. | |
| 5,892,198 A | 4/1999 | Barnes et al. | |
| 5,894,400 A | 4/1999 | Graven et al. | |
| 5,980,767 A | 11/1999 | Koshimizu et al. | |
| 6,020,794 A | 2/2000 | Wilbur | |
| 6,021,672 A | 2/2000 | Lee | |
| 6,042,686 A | 3/2000 | Dible et al. | |
| 6,048,435 A | 4/2000 | DeOrnellas et al. | |
| 6,110,214 A | 8/2000 | Klimasauskas | |
| 6,198,616 B1 | 3/2001 | Dahimene et al. | |
| 6,246,972 B1 | 6/2001 | Klimasauskas | |
| 6,472,822 B1 | 10/2002 | Chen et al. | |
| 6,522,121 B2 | 2/2003 | Coumou | |
| 6,535,785 B2 | 3/2003 | Johnson et al. | |
| 6,597,002 B1 | 7/2003 | Kondo | |
| 6,669,783 B2 | 12/2003 | Sexton et al. | |
| 6,677,246 B2 | 1/2004 | Scanlan et al. | |
| 6,750,711 B2 | 6/2004 | Chawla et al. | |
| 6,823,815 B2 | 11/2004 | Han et al. | |
| 6,838,635 B2 | 1/2005 | Hoffman et al. | |
| 6,862,557 B2 | 3/2005 | Jones et al. | |
| 6,873,114 B2 | 3/2005 | Avoyan et al. | |
| 6,972,524 B1 | 12/2005 | Marakbtanov et al. | |
| 6,983,215 B2 | 1/2006 | Coumou et al. | |
| 7,042,311 B1 | 5/2006 | Hilliker et al. | |
| 7,122,965 B2 | 10/2006 | Goodman | |
| 7,169,625 B2 | 1/2007 | Davis et al. | |
| 7,323,116 B2 | 1/2008 | Guiney et al. | |
| 7,359,177 B2 | 4/2008 | Yang et al. | |
| 7,375,038 B2 | 5/2008 | Kumar | |
| 7,435,926 B2 | 10/2008 | Jafarian-Tehrani | |
| 7,459,100 B2 | 12/2008 | Kiermasz et al. | |
| 7,480,571 B2 | 1/2009 | Howald et al. | |
| 7,505,879 B2 | 3/2009 | Tomoyasu et al. | |
| 7,728,602 B2 | 6/2010 | Valcore et al. | |
| 7,768,269 B2 | 8/2010 | Piptone et al. | |
| 7,858,898 B2 | 12/2010 | Bailey, III et al. | |
| 7,967,944 B2 | 6/2011 | Shannon et al. | |
| 8,040,068 B2 | 10/2011 | Coumou et al. | |
| 8,053,991 B2 * | 11/2011 | Kim et al. | 315/111.21 |
| 8,080,168 B2 | 12/2011 | Cirigliano | |
| 8,080,760 B2 | 12/2011 | Dhindsa et al. | |
| 8,264,238 B1 | 9/2012 | El-Chouelry | |
| 8,271,121 B2 | 9/2012 | Venugopal et al. | |
| 8,368,308 B2 * | 2/2013 | Banna et al. | 315/111.71 |
| 8,404,598 B2 | 3/2013 | Liao et al. | |
| 8,501,631 B2 | 8/2013 | Valcore et al. | |
| 8,901,935 B2 | 12/2014 | Valcore et al. | |
| 2003/0082835 A1 | 5/2003 | McChesney et al. | |
| 2003/0103793 A1 | 6/2003 | Murakoshi et al. | |
| 2004/0028837 A1 | 2/2004 | Fink | |
| 2004/0045506 A1 | 3/2004 | Chen et al. | |
| 2004/0060660 A1 | 4/2004 | Klimecky et al. | |
| 2004/0061448 A1 | 4/2004 | Avoyan et al. | |
| 2004/0087047 A1 | 5/2004 | Jaiswal et al. | |
| 2004/0107906 A1 | 6/2004 | Collins et al. | |
| 2004/0135590 A1 | 7/2004 | Quon | |
| 2004/0222184 A1 | 11/2004 | Hayami et al. | |
| 2004/0226657 A1 | 11/2004 | Hoffman | |
| 2005/0090118 A1 | 4/2005 | Shannon et al. | |
| 2005/0133163 A1 | 6/2005 | Shannon et al. | |
| 2005/0134186 A1 | 6/2005 | Brouk et al. | |
| 2005/0151479 A1 | 7/2005 | Avoyan et al. | |
| 2005/0252884 A1 | 11/2005 | Lam et al. | |
| 2006/0065631 A1 | 3/2006 | Cheng et al. | |
| 2006/0065632 A1 | 3/2006 | Cheng et al. | |
| 2006/0088655 A1 | 4/2006 | Collins et al. | |
| 2006/0100824 A1 | 5/2006 | Moriya | |
| 2006/0169582 A1 | 8/2006 | Brown et al. | |
| 2006/0231526 A1 * | 10/2006 | Donohue | 216/61 |
| 2006/0232471 A1 | 10/2006 | Coumou | |
| 2007/0021935 A1 | 1/2007 | Larson et al. | |
| 2007/0065594 A1 | 3/2007 | Chiang et al. | |
| 2007/0247074 A1 | 10/2007 | Paterson et al. | |
| 2007/0252580 A1 | 11/2007 | Dine et al. | |
| 2007/0262723 A1 | 11/2007 | Ikenouchi | |
| 2009/0151871 A1 | 6/2009 | Pease et al. | |
| 2009/0284156 A1 | 11/2009 | Banna et al. | |
| 2009/0294061 A1 | 12/2009 | Shannon et al. | |
| 2009/0295296 A1 | 12/2009 | Shannon et al. | |
| 2010/0099266 A1 | 4/2010 | Oswald et al. | |
| 2010/0270141 A1 | 10/2010 | Carter et al. | |
| 2011/0031216 A1 | 2/2011 | Liao et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2012/0073754 A1 | 3/2012 | De la Llera et al. | |

FOREIGN PATENT DOCUMENTS

| | | |
|---|---|---|
| JP | 2004-335594 A | 11/2004 |
| JP | 2005284046 A | 10/2005 |
| JP | 2005130198 A | 3/2012 |
| KR | 10-2005-0088438 A | 9/2005 |
| KR | 10-2005-0089995 A | 9/2005 |
| KR | 10-2007-0031915 A | 3/2007 |
| WO | 2008002938 A2 | 1/2008 |
| WO | 2012054306 A2 | 4/2012 |

OTHER PUBLICATIONS

Electromagnetic Waves and Antennas, Sophocles J. Orfanidis, Rutgers University, Aug. 25, 2013, Chapter 10.10.

Darnon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

PCT/US2010/057450 International Search Report and Written Opinion, mailed Jul. 18, 2011 (9 pages).

PCT/IB2013/051010 International Search Report and Written Opinion, mailed Jul. 3, 2013 (13 pages).

* cited by examiner

CHAMBER MATCHING USING VOLTAGE CONTROL MODE

FIELD

The present embodiments relate to performing chamber matching using a voltage control mode.

BACKGROUND

In plasma-based systems, plasma is generated within a plasma chamber. For example, a radio frequency (RF) generator supplies power to a plasma chamber. When a gas is supplied to the plasma chamber in addition to the power, plasma is struck within the plasma chamber. The plasma may be used for numerous processes, e.g., etching, depositing, cleaning, chemical deposition, etc.

Plasma chambers are different even under manufacturing control. Some minor differences between the plasma chambers, e.g., parts of the plasma chambers, cable routing within the plasma chambers, losses along RF transmission lines of plasma systems that include the plasma chambers, etc., may create enough difference between the chambers to induce variation in one or more of the processes. For example, a 1 to 2 percent variation in an etch rate is created due to the differences in the plasma chambers.

Also, a plasma chamber changes over time. For example, characteristics of a plasma chamber change with wear and tear of the plasma chamber, condition of walls of the plasma chamber, and/or erosion of parts of the plasma chamber.

It is in this context that embodiments described in the present disclosure arise.

SUMMARY

Embodiments of the disclosure provide apparatus, methods and computer programs for chamber matching using a voltage control mode. It should be appreciated that the present embodiments can be implemented in numerous ways, e.g., a process, an apparatus, a system, a device, or a method on a computer-readable medium. Several embodiments are described below.

In some embodiments, a voltage control mode is used to perform chamber-to-chamber matching and/or to perform intra-chamber matching. The voltage control mode is used to reduce variability in characteristics of one or more plasma chambers. The variability in characteristics of one or more plasma chambers creates harmonics that add a variation to a fundamental waveform. By measuring and extracting the harmonics, the variability in characteristics is accounted for. Based on the harmonics, power supplied to a plasma chamber is controlled and/or elements of a plasma system are replaced with other corresponding elements to reduce the effect of the harmonics on the one or more plasma chambers.

In several embodiments, a method for compensating for harmonics produced during plasma processing in a plasma chamber is described. The method includes retrieving a measurement of a combined waveform. The combined waveform includes a fundamental waveform and a harmonic waveform. The combined waveform defines a voltage proximate to a surface of a chuck, which is coupled to a radio frequency (RF) transmission line. The RF transmission line is coupled to an impedance matching circuit. The impedance matching circuit is coupled to an RF generator. The method further includes extracting the fundamental waveform from the combined waveform, determining a difference between a magnitude of the combined waveform and a magnitude of the fundamental waveform, and controlling the RF generator to compensate for the difference. The method is executed by one or more processors.

In a number of embodiments, a method for compensating for harmonics produced during plasma processing in a plasma chamber is described. The method includes retrieving a measurement of a combined waveform, which includes a fundamental waveform and a harmonic waveform. The combined waveform defines a variable proximate to a surface of a chuck, the chuck coupled to an RF transmission line, which is coupled to an impedance matching circuit. The impedance matching circuit is coupled to an RF generator. The method further includes extracting the fundamental waveform from the combined waveform, determining a difference between a phase of the combined waveform and a phase of the fundamental waveform, and receiving an indication of a change to a plasma system. The change is made to compensate for the difference. The plasma system includes the RF transmission line, an RF cable coupling the impedance matching circuit to the RF generator, the impedance matching circuit, or a combination thereof. The method is executed by one or more processors.

In some embodiments, a method for performing chamber-to-chamber matching is described. The method includes retrieving a measurement of a combined waveform, which includes a fundamental waveform and a harmonic waveform. The combined waveform defines a voltage proximate to a surface of a chuck, which is coupled to an RF transmission line. The RF transmission line is coupled to an impedance matching circuit, which is further coupled to an RF generator. The method includes extracting the fundamental waveform from the combined waveform, receiving an indication of coupling another chuck to the RF transmission line, and retrieving a measurement of another combined waveform. The other combined waveform defines a voltage proximate to a surface of the other chuck. The method includes determining a difference between a magnitude of the other combined waveform and a magnitude of the fundamental waveform and controlling the RF generator to compensate for the difference. The method is executed by one or more processors.

In various embodiments, a method for performing chamber-to-chamber matching is described. The method includes retrieving a measurement of a combined waveform. The combined waveform includes a fundamental waveform and a harmonic waveform. The combined waveform defines a voltage proximate to a surface of a chuck, which is coupled to an RF transmission line. The RF transmission line is coupled to an impedance matching circuit, which is coupled to an RF generator. The method includes extracting the fundamental waveform from the combined waveform, receiving an indication of coupling another chuck to the RF transmission line, and retrieving a measurement of another combined waveform. The other combined waveform defines a voltage proximate to a surface of the other chuck. The method includes determining a difference between a phase of the other combined waveform and a phase of the fundamental waveform and receiving an indication of a change to a plasma system. The change is made to compensate for the difference. The plasma system includes the RF transmission line, an RF cable coupling the impedance matching circuit to the RF generator, the impedance matching circuit, the other chuck, or a combination thereof. The method is executed by one or more processors.

In some embodiments, a method for performing intra-chamber matching is described. The method includes retrieving a measurement of a combined waveform, which includes a fundamental waveform and a harmonic waveform. The combined waveform defines a voltage proximate to a surface of a chuck of a plasma chamber in a first condition. The chuck is coupled to an RF transmission line, which is coupled to an impedance matching circuit. The impedance matching circuit is coupled to an RF generator. The method includes extracting the fundamental waveform from the combined waveform, receiving an indication of a change in the plasma chamber from the first condition to a second condition, and retrieving a measurement of another combined waveform generated within the plasma chamber. The other combined waveform is generated when the plasma chamber is in the second condition. The method includes determining a difference between a magnitude of the other combined waveform and a magnitude of the fundamental waveform. The method includes controlling the RF generator to compensate for the difference. The method is executed by one or more processors.

In various embodiments, a method for performing intra-chamber matching is described. The method includes retrieving a measurement of a combined waveform, which includes a fundamental waveform and a harmonic waveform. The combined waveform defines a voltage proximate to a surface of a chuck of a plasma chamber in a first condition. The chuck is coupled to an RF transmission line, which is coupled to an impedance matching circuit. The impedance matching circuit is coupled to an RF generator. The method includes extracting the fundamental waveform from the combined waveform, receiving an indication of a change the plasma chamber from the first condition to a second condition, and retrieving a measurement of another combined waveform. The other combined waveform is generated when the plasma chamber is in the second condition. The method includes determining a difference between a phase of the other combined waveform and a phase of the fundamental waveform and receiving an indication of a change to a plasma system. The change is made to compensate for the difference. The plasma system includes the RF transmission line, an RF cable coupling the impedance matching circuit to the RF generator, the impedance matching circuit, the chuck, or a combination thereof. The method is executed by one or more processors.

Some advantages of the above-described embodiments include reducing an effect of intra-chamber or chamber-to-chamber variation on plasma. For example, a combined waveform is obtained from measurement of plasma voltage. A fundamental waveform is extracted from the combined waveform. Power supplied to a plasma chamber that experiences the intra-chamber or chamber-to-chamber variation is changed to match an amplitude of the combined waveform with an amplitude of the fundamental waveform. In some embodiments, instead of power or in addition to power matching, one or more elements of a plasma system that includes the plasma chamber, which experiences intra-chamber or chamber-to-chamber variation, are changed to match a phase of the combined waveform with a phase of the fundamental waveform.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for chamber matching using a voltage control mode. It will be apparent that the present embodiments may be practiced without some or all of these specific details. In other instances, well known process operations have not been described in detail in order not to unnecessarily obscure the present embodiments.

Figure 1A:
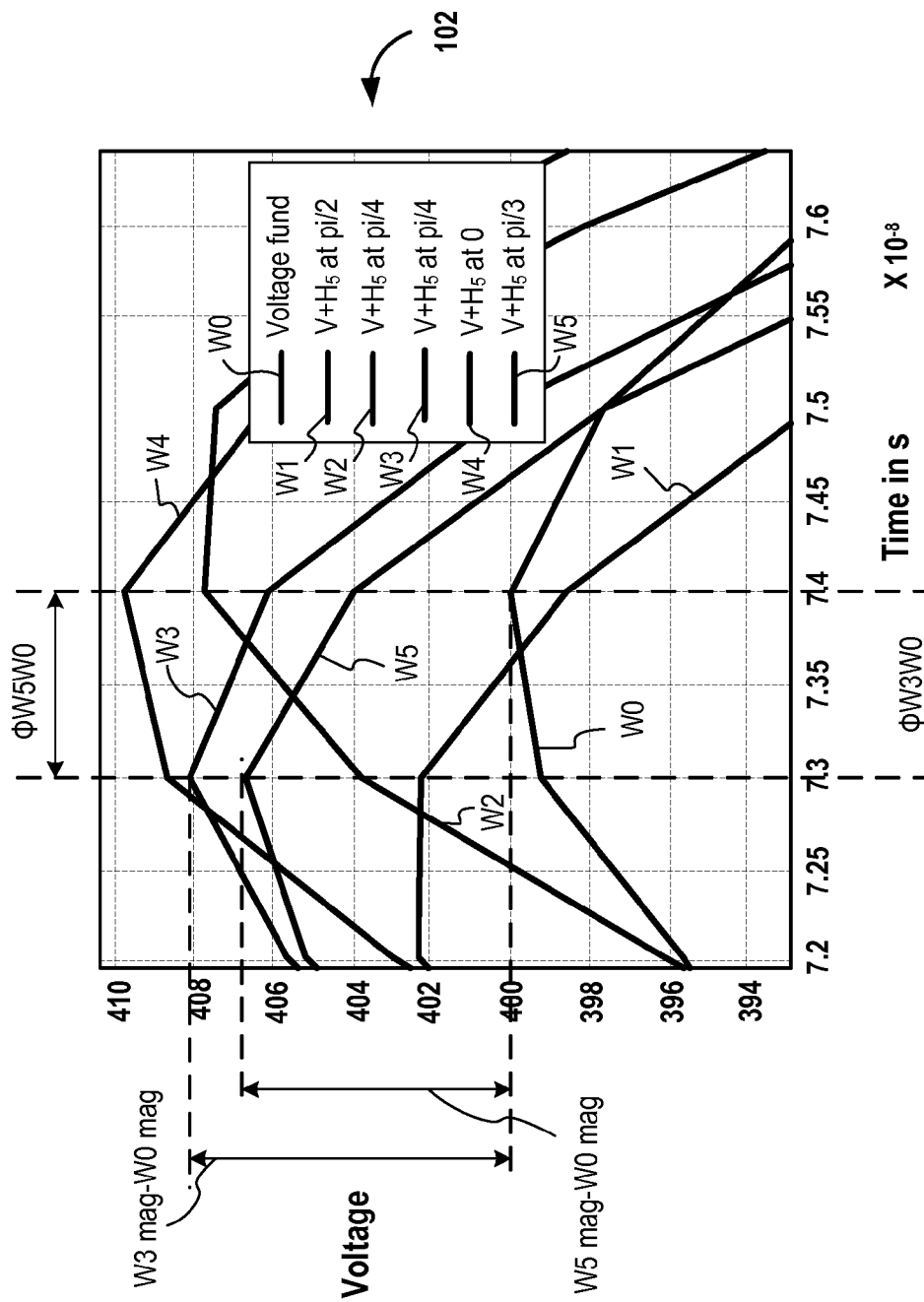
FIG. 1A shows an embodiment of a graph used to illustrate chamber matching using a voltage control mode, in accordance with some embodiments described in the present disclosure.

FIG. 1A shows an embodiment of a graph 102 used to illustrate chamber matching using a voltage control mode. The graph 102 plots voltage along a y-axis and time along an x-axis. A combined waveform W5, which is a sum of a fundamental waveform W0 and a fifth harmonic waveform of the fundamental waveform W0, is plotted and the combined waveform W5 has a phase of $\pi/3$ relative to a phase of the fundamental waveform W0.

The combined waveform W5 is generated when plasma is generated within a plasma chamber. For example, the combined waveform W5 plots a voltage of plasma within the plasma chamber.

The fundamental waveform W0 is extracted from the combined waveform W5.

A difference in a peak magnitude W5mag of the combined waveform W5 and a peak magnitude W0mag of the fundamental waveform W0 is determined. The peak magnitude W5mag of the combined waveform W5 is decreased to match the peak magnitude W0mag of the fundamental waveform W0.

In some embodiments, a peak magnitude of a waveform is a maximum magnitude of the waveform. For example, a sinusoidal waveform or a nearly sinusoidal waveform has peaks and valleys. A peak magnitude is a magnitude of peaks of the sinusoidal waveform or the nearly sinusoidal waveform. As another example, a peak magnitude is a maximum of all magnitudes of a waveform.

In several embodiments, instead of decreasing the peak magnitude W5mag to match the peak magnitude W0mag, when a peak magnitude of a combined waveform is less than the peak magnitude W0mag, the peak magnitude of the combined waveform is increased to match the peak magnitude W0mag.

In some embodiments, a difference $\phi$W5W0 in phases of the combined waveform W5 and the fundamental waveform W0 is determined. For example, the difference $\phi$W5W0 in phases of the combined waveform W5 and the fundamental waveform W0 when the combined waveform W5 achieves the peak magnitude W5mag and the fundamental waveform W0 achieves the peak magnitude W0mag is determined. The phase $\phi$W5 of the combined waveform W5 is increased by the phase difference $\phi$W5W0 between the phase $\phi$W0 of the fundamental waveform W0 and the phase $\phi$W5 of the combined waveform W5. In various embodiments, when the $\phi$W5 of the combined waveform W5 is increased by the phase difference $\phi$W5W0, a peak magnitude of the combined waveform W5 aligns with a peak magnitude of the fundamental waveform W0.

In several embodiments, instead of increasing the phase $\phi$W5 of the combined waveform W5 by the phase difference $\phi$W5W0, a phase of a combined waveform (not shown) is decreased by a phase difference between the fundamental waveform W0 and the combined waveform to align a peak magnitude of the fundamental waveform W0 with a peak magnitude of the combined waveform. For example, instead of increasing the phase $\phi$W5 of the combined waveform W5 by the phase difference W5W0, a phase of a combined waveform (not shown) is decreased by a phase difference between a peak magnitude of the fundamental waveform W0 and a peak magnitude of the combined waveform (not shown) to align a peak magnitude of the fundamental waveform W0 with a peak magnitude of the combined waveform (not shown).

Similarly, a combined waveform W3, which is a sum of the fundamental waveform W0 and a fifth harmonic waveform of the fundamental waveform W0, is plotted. The combined waveform W3 has a phase of $\pi/4$ relative to a phase of the fundamental waveform W0.

Also, the combined waveform W3 is generated when plasma is generated within a plasma chamber, which may be the same or different from the plasma chamber that in which the combined waveform W5 is generated.

The fundamental waveform W0 is extracted from the combined waveform W3 in a similar manner in which the fundamental waveform W0 is extracted from the combined waveform W5.

A difference in a peak magnitude W3mag of the combined waveform W3 and a peak magnitude W0mag of the fundamental waveform W0 is determined. The peak magnitude W3mag of the combined waveform W3 is decreased to match the peak magnitude W0mag of the fundamental waveform W0.

In some embodiments, a difference $\phi$W3W0 in phases of the combined waveform W3 and the fundamental waveform W0 when the combined waveform W3 achieves the peak magnitude W3mag and the fundamental waveform W0 achieves the peak magnitude W0mag is determined. The phase $\phi$W3 of the combined waveform W3 is changed by the phase difference $\phi$W3W0 between the phase $\phi$W0 of the fundamental waveform W0 and the phase $\phi$W3 of the combined waveform W3 to match the phase $\phi$W3 of the combined waveform W3 with the phase $\phi$W0 of the fundamental waveform W0. For example, the phase $\phi$W3 of the combined waveform W3 is changed by the phase difference $\phi$W3W0 between the phase $\phi$W0 of the fundamental waveform W0 and the phase $\phi$W3 of the combined waveform W3 to align a peak magnitude of the combined waveform W3 with a peak magnitude of the fundamental waveform W0. In this case, the phase difference $\phi$W3W0 is zero.

In several embodiments, the combined waveform W3 is generated when a plasma chamber 1 is in a condition 1 and the combined waveform W5 is generated when the plasma chamber 1 is in a condition 2. In some embodiments, the condition 2 is a condition that occurs at a different time than a time of occurrence of the condition 1. For example, the condition 2 occurs after corrosion of one or more elements of the plasma chamber 1 and the condition 1 occurs before the corrosion.

In several embodiments, the condition 2 is a condition that occurs after use of the plasma chamber 1 to process a wafer and the condition 1 is a condition that occurs before the use. The plasma chamber 1 is in the condition 1 before the use. For example, after the plasma chamber 1 is used to perform wet cleaning of a wafer, the plasma chamber 1 has a different condition, which is the condition 2, than before the performance of the wet cleaning. As another example, after the plasma chamber 1 is used to etch a wafer, the plasma chamber 1 has a different condition, which is the condition 2, than before the performance of the etching. As yet another example, after process gases are supplied within the plasma chamber 1, the plasma chamber 1 has a different condition than before the supplying of the process gases. Some examples of processing the wafer 154 include etching the wafer 154, depositing materials on the wafer 154, supplying process gases proximate to the wafer 154, cleaning the wafer 154, etc.

In various embodiments, the combined waveform W3 is generated when power is supplied to the plasma chamber 1 and the combined waveform W5 is generated when power is supplied to a plasma chamber 2. In some embodiments, the plasma chamber 2 has the same structure as that of the plasma chamber 1. For example, the plasma chamber 2 includes elements that have same dimensions as that of corresponding elements in the plasma chamber 1. As another example, the plasma chamber 2 includes elements that are of the same type as that of corresponding elements in the plasma chamber 1. To illustrate, a transformer coupled plasma (TCP) chamber is of a different type than an inductively coupled plasma (ICP) chamber and both the TCP and the ICP chambers are of different types than an electron cyclotron resonance (ECR) plasma chamber.

Examples of elements of a plasma chamber include an upper electrode, a lower electrode, an upper plasma exclusion zone (PEZ) ring, a lower PEZ ring, a heater, a confinement ring assembly, an edge ring, an insulator layer, gas distribution apertures, walls of the plasma chamber, an upper dielectric ring surrounding the upper electrode, an upper electrode extension surrounding the upper dielectric ring, a lower dielectric ring surrounding the lower electrode, a lower electrode extension surrounding the lower dielectric ring, etc. The lower electrode is made of a metal, e.g., anodized aluminum, alloy of aluminum, etc. Also, the upper electrode is made of a metal, e.g., aluminum, alloy of aluminum, etc. The upper electrode is located opposite to and facing the lower electrode.

Examples of dimensions of an element include a size of the element, a length of the element, a depth of the element, a width of the elements, a surface area of the element, a volume occupied by the element, etc.

Examples of elements of different types include a plate electrode, an electric coil electrode, etc.

In various embodiments, the plasma chamber 2 is structurally identical to plasma chamber 1 and has a different identification code than that of the plasma chamber 1. For example, an entity identifies the plasma chamber 1 using an identity code aaaa and the entity identifies the plasma chamber 2 using an identity code bbbb. Examples of an entity include a corporation, a partnership, etc.

In a number of embodiments, the plasma chamber 2 is structurally identical to the plasma chamber 1 and is used to perform the same function as that of the plasma chamber 1. Examples of a function performed by a plasma chamber include physical vapor deposition (PVD), chemical vapor deposition (CVD), plasma-enhanced CVD (PECVD), metal CVD, a high-density plasma CVD (HDP-CVD) function, a photoresist strip function, a photoresist surface preparation, ultraviolet thermal processing (UVTP), etc.

In various embodiments, the plasma chamber 2 is structurally and functionally identical to plasma chamber 1 and has a different identification code than that of the plasma chamber 1.

In several embodiments, power is supplied to the plasma chamber 1, which is a golden chamber. In these embodiments, the plasma chamber 1 has a higher yield than that of the plasma chamber 2. When power is supplied to the plasma chamber 1, the combined waveform W3 is generated and the fundamental waveform W0 is extracted from the combined waveform W3. Also, in these embodiments, when power is supplied to the plasma chamber 2, the combined waveform W5 is generated. Moreover, power supplied to the plasma chamber 2 is adjusted to modify the peak magnitude W5mag of the combined waveform W5 to achieve the magnitude W0mag of the fundamental waveform that is generated using the plasma chamber 1.

In some embodiments, instead of adjusting the power supplied to the plasma chamber 2 to adjust the peak magnitude W5mag to match the peak magnitude W0mag, elements of a plasma system that includes the plasma chamber 2 are changed, e.g., replaced, tweaked, etc., to reduce the phase difference $\phi$W5W0. For example, a user changes an RF transmission line of the plasma chamber 2 to reduce the phase difference $\phi$W5W0. As another example, a user tweaks a distance between plates of a capacitor of an impedance matching circuit of the plasma chamber 2 to reduce the phase difference $\phi$W5W0.

Other examples of elements of a plasma system include an RF cable that couples an RF generator of the plasma system to an impedance matching circuit of the plasma system, an inductor of the impedance matching circuit, and an element of a plasma chamber of the plasma system.

In various embodiments, instead of changing elements of a plasma system randomly or sequentially, a scan, e.g., an impedance scan, a network scan, etc., is performed at one or more points between the x MHz RF generator and a wafer to determine an element that is to be changed. For example, an impedance scanner is coupled to an RF transmission line to generate impedance characteristics of elements of the plasma system between the RF transmission line and an end of the plasma system. It should be noted that in several embodiments, a plasma chamber is located at an end of the plasma system and an RF generator is located at a beginning of the plasma system. Impedance characteristics may include a peak, which may be in phase with a phase of a harmonic waveform. Upon determining that the peak is in phase with a phase of the harmonic waveform, it is determined that an element that is to be changed lies between the impedance scanner and an output of the RF transmission line or within the plasma chamber. Upon determining that the peak is out of phase with a phase of the harmonic waveform, the impedance scanner is coupled to a matchbox coupled to the RF transmission line to determine whether an element of the plasma system that is to be changed is located between the impedance scanner and the end of the plasma system.

Also, in some embodiments, instead of the plasma chamber 1 being a golden chamber, the plasma chamber 2 is a golden chamber. For example, the plasma chamber 2 has a higher yield than the plasma chamber 1. In these embodiments, instead of using the plasma chamber 1 to generate the fundamental waveform W0, the plasma chamber 2 is used to generate the fundamental waveform W0. For example, power is supplied to the plasma chamber 2 to generate plasma within the plasma chamber 2. Voltage of the plasma is measured to generate the combined waveform W3. The fundamental waveform W0 is extracted from the combined waveform W3. Continuing with the example, when power is supplied to the plasma chamber 1, the combined waveform W5 is generated. Power supplied to the plasma chamber 1 is adjusted to modify the peak magnitude W5mag of the combined waveform W5 to achieve the peak magnitude W0mag of the fundamental waveform W0 that is generated based on the waveform W3 of the plasma chamber 2.

In some embodiments, instead of adjusting the power supplied to the plasma chamber 2 to adjust the peak magnitude W5mag to match the peak magnitude W0mag, one or more elements of a plasma system that includes the plasma chamber 2 are changed to reduce the phase difference $\phi$W5W0.

A plasma chamber has a higher yield than another plasma chamber when the higher yield plasma chamber is used to etch a wafer to achieve a higher aspect ratio than that achieved using the lower yield plasma chamber, when use of the higher yield plasma chamber results in wafers that are cleaner than those cleaned using the lower yield plasma chamber, when the higher yield plasma chamber etches at a faster rate than that achieved using the lower yield plasma chamber, when the higher yield plasma chamber cleans wafers at a faster rate than that achieved using the lower yield plasma chamber, when the higher yield plasma chamber has a higher rate of processing wafers than that of the lower yield plasma chamber, or a combination thereof.

In some embodiments, the plasma chamber 1 is a golden chamber when the plasma chamber 1 is in the condition 1. In these embodiments, the combined waveform W3 is generated by providing power to the plasma chamber 1 in the condition 1. The fundamental waveform W0 is extracted from the combined waveform W3. When the plasma chamber 1 is in the condition 2, the combined waveform W5 is generated from a measurement of voltage. The measurement of voltage of plasma is received by a processor of a host system when the plasma chamber 1 is in the condition 2. The host system is further described below. Power supplied to the plasma chamber 1 in the condition 2 is adjusted to change the peak magnitude W5mag to match the peak magnitude W0mag of the fundamental waveform W0 that is generated based on the condition 1 of the plasma chamber 1.

Moreover, in various embodiments, instead of adjusting the power supplied to the plasma chamber 1 in the condition 2 to achieve the peak magnitude W0mag of the fundamental waveform W0 that is generated based on the condition 1, one or more elements of a plasma system that includes the plasma chamber 1 in the condition 2 are changed to reduce the phase difference $\phi$W5W0.

Similarly, in various embodiments, the plasma chamber 1 is a golden chamber when the plasma chamber 1 is in the condition 2. In these embodiments, the combined waveform W3 is generated by providing power to the plasma chamber 1 in the condition 2. The fundamental waveform W0 is extracted from the combined waveform W3. When the plasma chamber 1 is in the condition 1, the combined waveform W5 is generated. Power supplied to the plasma chamber 1 in the condition 1 is adjusted to change the peak magnitude W5mag to match the peak magnitude W0mag of the fundamental waveform W0 that is generated based on the condition 2 of the plasma chamber 1.

Furthermore, in various embodiments, instead of adjusting the power supplied to the plasma chamber 1 in the condition 1 to achieve the peak magnitude W0mag of the fundamental waveform W0 that is generated based on the condition 2, one or more elements of a plasma system that includes the plasma chamber 1 in the condition 1 are changed to reduce the phase difference $\phi$W3W0.

In some embodiments, power supplied to a plasma chamber is controlled to match a peak magnitude of a combined waveform generated using the plasma chamber with a peak magnitude of a fundamental waveform that is generated using another plasma chamber regardless of whether the other plasma chamber is a golden chamber. For example, there is no need to determine that the other plasma chamber is a golden chamber.

In several embodiments, a phase of a voltage waveform of voltage of plasma generated within a plasma chamber is matched with a phase of a voltage waveform of voltage of plasma generated within another plasma chamber independent of whether the other plasma chamber is a golden chamber.

In a number of embodiments, power supplied to a plasma chamber is controlled to match a peak magnitude of a combined waveform that is generated during the condition 2 of the plasma chamber with a peak magnitude of a fundamental waveform that is generated during the condition 1 of the same plasma chamber regardless of whether the plasma chamber operates as a golden chamber during the condition 1.

In some embodiments, a phase of a waveform of voltage of plasma generated during the condition 2 of a plasma chamber is matched with a phase of a waveform of voltage of plasma generating during the condition 1 of the plasma chamber regardless of whether the plasma chamber operates as a golden chamber during the condition 1.

Figure 1B:
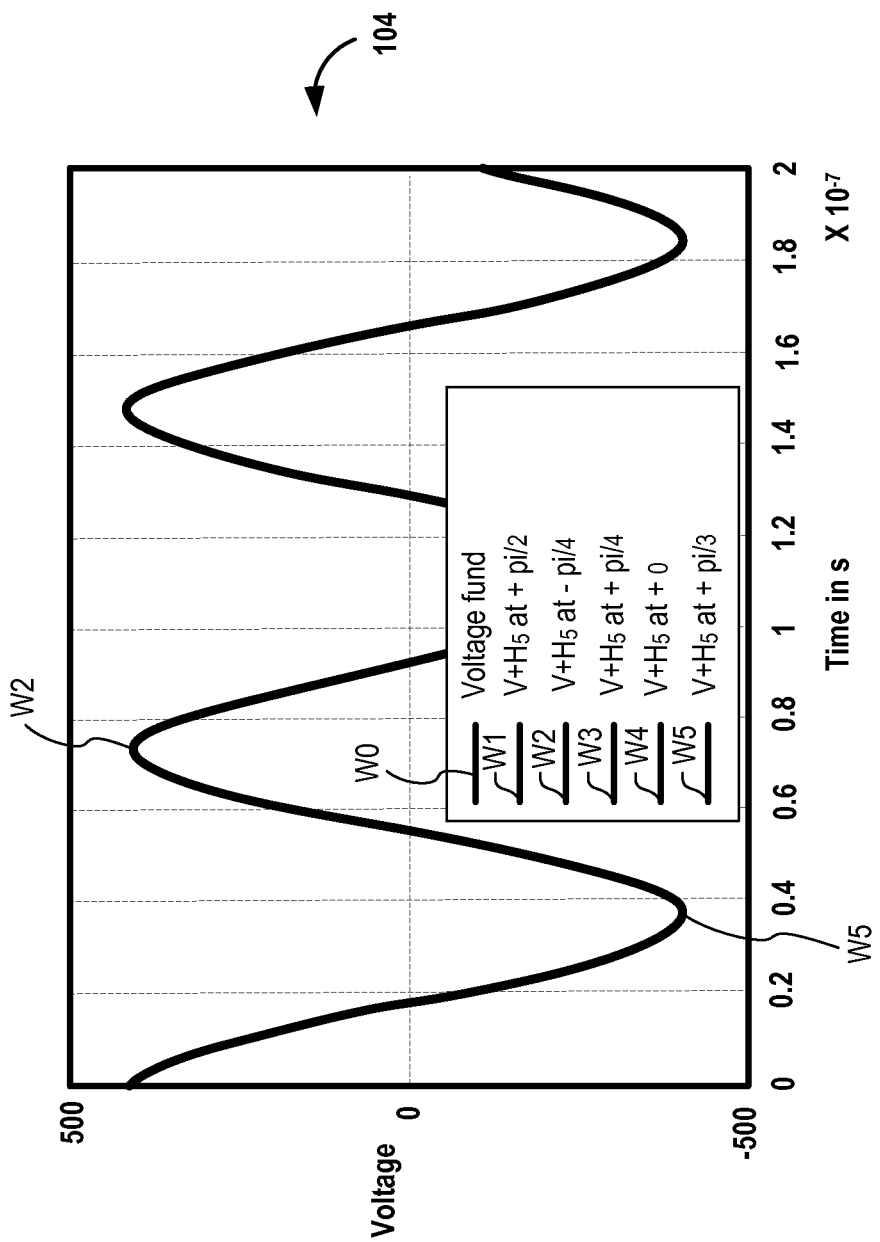
FIG. 1B is an embodiment of a graph for illustrating a fundamental waveform and combined waveforms that include a sum of the fundamental waveform and harmonics of the combined waveforms, in accordance with various embodiments described in the present disclosure.

FIG. 1B is an embodiment of a graph 104 for illustrating the fundamental waveform W0 and combined waveforms W1, W2, W3, W4, and W5 that include a sum of the fundamental waveform W0 and harmonics of the combined waveforms W1, W2, W3, W4, and W5 at different phases. For example, the combined waveform W1 is a sum of the fundamental waveform W0 and a fifth harmonic of the fundamental waveform W0 at a phase $\pi/2$ relative to the phase of the fundamental waveform W0. As another example, the combined waveform W2 is a sum of the fundamental waveform W0 and a fifth harmonic of the fundamental waveform W0 at a phase $-\pi/4$ relative to the phase of the fundamental waveform W0. As yet another example, the combined waveform W3 is a sum of the fundamental waveform W0 and a fifth harmonic of the fundamental waveform W0 at a phase $\pi/4$ relative to the phase of the fundamental waveform W0. As another example, the combined waveform W4 is a sum of the fundamental waveform W0 and a fifth harmonic of the fundamental waveform W0 at a phase 0 relative to the phase of the fundamental waveform W0. As yet another example, the combined waveform W5 is a sum of the fundamental waveform W0 and a fifth harmonic of the fundamental waveform W0 at a phase $\pi/3$ relative to the phase of the fundamental waveform W0.

It should be noted that in some embodiments, each waveform W0, W1, W2, W3, W4, and W5 is sinusoidal or nearly sinusoidal in form.

Figure 2:
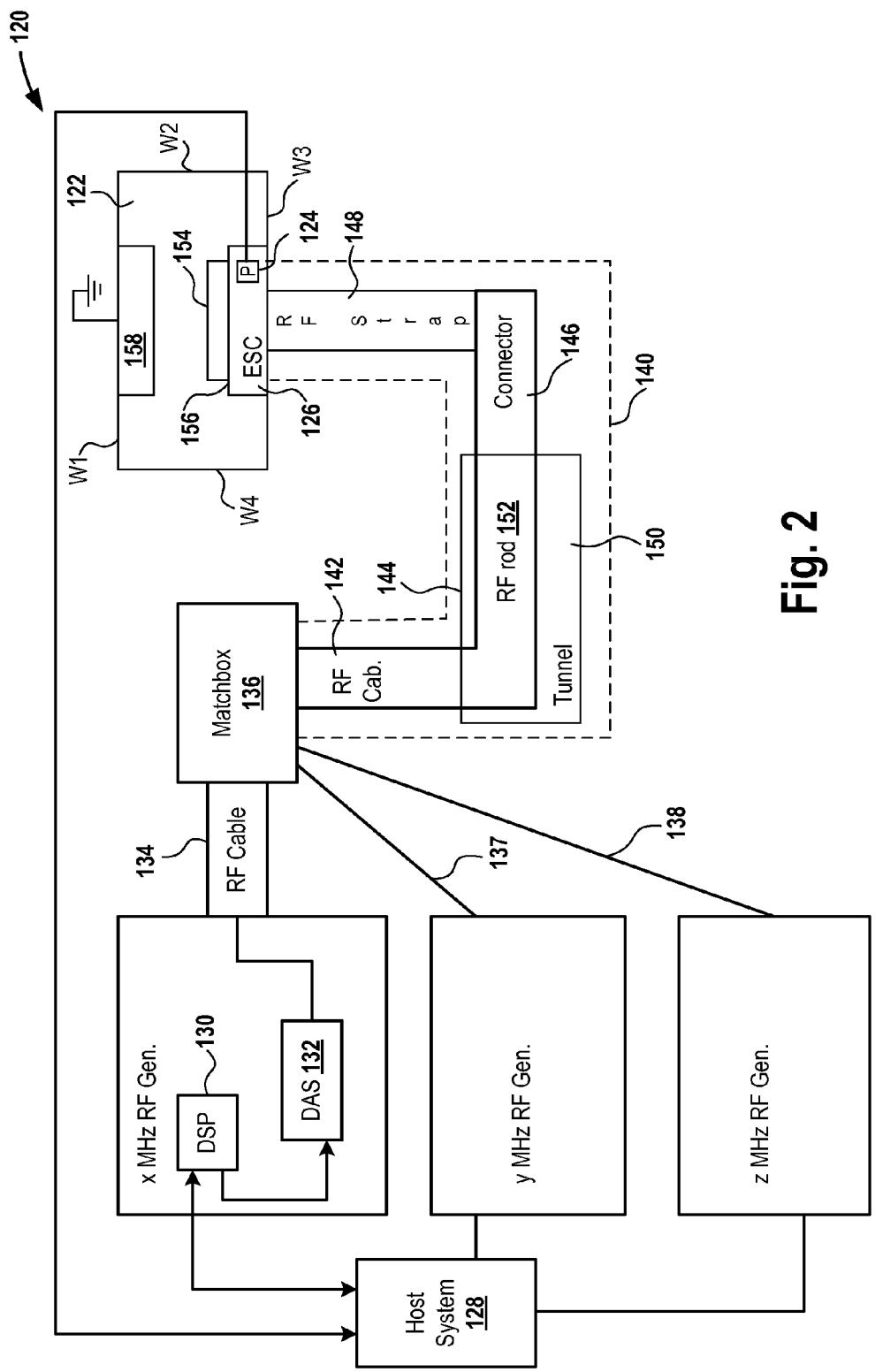
FIG. 2 is a block diagram of an embodiment of a plasma system for measuring voltage that is generated within a plasma chamber by using a probe within an electrostatic chuck (ESC), in accordance with some embodiments described in the present disclosure.

FIG. 2 is a block diagram of an embodiment of a plasma system 120 for measuring voltage that is generated within a plasma chamber 122 by using a probe 124 within an electrostatic chuck (ESC) 126.

In some embodiments, the waveform W3 is generated during the condition 1 of the plasma chamber 122 and the waveform W5 is generated during the condition 2 of the plasma chamber 122.

A host system 128 is coupled to one or more RF generators, e.g., an x megahertz (MHz) RF generator, a y MHz RF generator, a z MHz RF generator, etc. The x MHz generator may be a 2 MHz RF generator, the y MHz RF generator may be a 27 MHz RF generator, and the z MHz RF generator may be a 60 MHz RF generator.

Examples of the host system 128 include a computer, a processor-based system, a workstation, a laptop, a desktop, a tablet, a cell phone, etc.

As used herein, a processor may be an application specific integrated circuit (ASIC), a programmable logic device (PLD), a microprocessor, a central processing unit (CPU), etc.

In some embodiments, instead of the 2 MHz RF generator, an RF generator of a different frequency, e.g., 5 MHz RF generator, may be used. Similarly, RF generators of different frequencies may be used instead of the 27 and 60 MHz RF generators.

In several embodiments, the x MHz RF generator may be a 27 MHz RF generator. In these embodiments, the y and z MHz RF generators are 2 and 60 MHz RF generators.

In a number of embodiments, the x MHz RF generator may be a 60 MHz RF generator. In these embodiments, the y and z MHz RF generators are 2 and 27 MHz RF generators.

The host system 128 provides power values and a frequency of operation to a digital signal processor (DSP) 130 of the x MHz RF generator. The DSP 130 sends the power values and the frequency to a driver and amplifier system (DAS) 132 of the x MHz RF generator.

The DAS 132 receives the power values and the frequency and generates an RF signal having the power values and the frequency. The RF signal is supplied via an RF cable 134 to a matchbox 136, which is an impedance matching circuit.

In some embodiments, the DAS 132 amplifies an RF signal that is generated by a driver of the DAS to generate an amplified RF signal, which is supplied via the RF cable 134 to the matchbox 136.

In various embodiments, when an RF signal is generated by the x MHz RF generator, the y and z MHz RF generators do not generate RF signals. For example, the y and z MHz RF generators are turned off when the x MHz RF generator is used to generate an RF signal.

An impedance matching circuit includes electric circuit components, e.g., inductors, capacitors, etc. to match an impedance of a power source coupled to the impedance matching circuit with an impedance of a load coupled to the impedance matching circuit. For example, the matchbox 136 matches an impedance of a source, which includes the x, y, and z MHz RF generators, RF cables 134, 137, and 138 coupling the matchbox 136 to the x, y, and z MHz RF generators with an impedance of an RF transmission line 140 and the plasma chamber 122. An impedance match between a power source and a load reduces chances of power being reflected from the load towards the power source.

The RF transmission line 140 is coupled to the matchbox 136 and to the ESC 126 of the plasma chamber 122. The RF transmission line 140 includes an RF cable 142, which is coupled to an RF tunnel 144, and the RF tunnel 144 is coupled to an RF strap 148. Within the RF tunnel 144 lays an insulator 150 and an RF rod 152. The insulator 150 insulates the RF rod 152 from a sheath of the RF tunnel 144. The RF rod 152 is coupled via the connector 146 to the RF strap 148, which is sometimes also know as an RF spoon. The RF strap 148 is coupled to the lower electrode of the ESC 126.

A wafer 154, e.g., a semiconductor wafer, is supported on an upper surface 156 of the ESC 126. Integrated circuits, e.g., application specific integrated circuits (ASICs), programmable logic devices (PLDs), etc. are developed on the wafer 154 and the integrated circuits are used in a variety of devices, e.g., cell phones, tablets, smart phones, computers, laptops, networking equipment, etc. An upper electrode 158 faces the lower electrode of the ESC 126.

The plasma chamber 122 has walls W1, W2, W3, and W4 that enclose plasma that is generated within the plasma chamber 122. It should be noted that in some embodiments, the plasma chamber 122 includes more than four walls. In several embodiments, a wall of the plasma chamber 122 may be perpendicular to an adjacent wall. In various embodiments, a wall of the plasma chamber 122 may form a non-perpendicular angle with an adjacent wall of the plasma chamber 122.

The probe 124 is embedded within the ESC 126. In several embodiments, instead of being embedded within the ESC 126, the probe 124 is coupled to the ESC 126. In various embodiments, the probe 124 may be located within or outside the plasma chamber 122 and is coupled to the ESC 126.

Examples of the probe 124 include a voltage probe that measures voltage and a voltage and current probe that measures voltage and current. For example, a voltage probe measures voltage amplitude and a phase of the voltage. As another example, a voltage and current probe measures a voltage amplitude, a current amplitude, a phase of the voltage, a phase of the current, and a phase between the voltage and the current. The probe 124 is coupled to the host system 128. For example, the probe 124 is coupled to an analog-to-digital converter of the host system 128 and the analog-to-digital converter is coupled to a processor of the host system 128.

In some embodiments, the probe 124 has a bandwidth to filter in a frequency of the fundamental waveform W0 and harmonics of a combined waveform that includes the fundamental waveform W0. For example, the probe 124 includes a low-pass filter that allows passage of the fundamental frequency of the fundamental waveform W0 and harmonics frequency, which is frequency of harmonics of a combined waveform that includes the fundamental waveform W0.

An RF signal that is generated by the x MHz RF generator is communicated via the RF cable 134, the matchbox 136, the RF cable 142, the RF rod 152, the connector 146, and the RF strap 148 to the lower electrode of the ESC 126.

In some embodiments, the upper electrode 158 includes gas distribution apertures that are coupled to a central gas feed (not shown). The central gas feed receives one or more process gases from a gas supply (not shown). Examples of process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 158 is grounded.

When the process gas is supplied between the upper electrode 158 and the lower electrode and when the RF signal is supplied to the lower electrode, the process gas is ignited to strike plasma within the plasma chamber 122. The plasma is stricken proximate to the ESC 126. For example, the plasma is generated on top of the upper surface 156. As another example, when the wafer 154 is placed on the upper surface 156 and the upper surface 156 is covered by the wafer 154, the plasma is stricken on top of the wafer 154. As yet another example, when the wafer 154 is placed on the upper surface 156 and a portion of the upper surface 156 is not covered by the wafer 154, plasma is generated on top of the wafer 154 and on top of the portion of the upper surface 156.

When plasma is stricken, the probe 124 measures a voltage of the plasma and sends the measurement to the host system 128. The host system 128 receives the measurement of the voltage and the analog-to-digital converter of the host system 128 converts the measurement from an analog form to a digital form. In some embodiments, the probe 124 converts the measurement from an analog to a digital form before sending the measurement to the host system 128. The processor of the host system 128 generates the waveform W3 as a function of time t based on the measurement of the voltage of the plasma.

Also, when a condition of the plasma chamber 122 changes after the waveform W3 is generated, the probe 124 measures the voltage of the plasma and provides the measurement to the host system 128. The processor of the host system 128 receives the measurement of the voltage from the probe 124 and determines the waveform W5 as a function of time based on the measurement.

In several embodiments, the measurement of voltage over time results in a combined waveform.

In some embodiments, the processor of the host system 128 stores a combined waveform within a storage device, e.g., a random access memory (RAM), a read-only memory (ROM), or a combination thereof. The processor retrieves, e.g., reads, accesses, etc., the combined waveform from the storage device.

The processor of the host system 128 extracts the fundamental waveform W0 from the combined waveform W5. For example, the processor of the host system 128 includes multiple filters of successively increasing frequency ranges. Continuing with the example, a first frequency range is from q MHz to n MHz, a second frequency range is from q MHz to n+m MHz, a third frequency range is from q MHz to n+m+p MHz, where q, n, m, and p are positive real numbers, where each of n, m, and p is greater than q. The combined waveform W5 is provided as an input to the filters. In some embodiments, q is a pre-determined frequency. One of the filters allows passage of the lowest of all the frequency ranges. A lowest frequency in the lowest frequency range is a fundamental frequency of the fundamental waveform. The fundamental waveform is determined by the processor to be a sinusoidal waveform having the fundamental frequency.

In some embodiments, the filters of the host system 128 are low pass filters. In various embodiments, the filters of the host system 128 are band pass filters.

It should be noted that instead of the processor of the host system 128, a hardware integrated circuit, e.g., a PLD, an ASIC, etc., may be used.

The processor of the host system 128 performs intra-chamber matching for the plasma chamber 122 in a manner described above with reference to FIG. 1. For example, the processor decreases the peak magnitude W5mag of the combined waveform W5 to match the peak magnitude W0mag of the fundamental waveform W0 that is extracted from the combined waveform W3.

The processor of the host system 128 determines power, e.g., power magnitude, etc., to be supplied to the plasma chamber 122 corresponding to the peak magnitude W0mag. For example, the processor of the host system 128 looks up a database within the storage device, e.g., a storage hardware unit, etc., of the host system 128 to determine the power to be supplied to the plasma chamber 122 based on the peak magnitude W0mag. As another example, the x MHz RF generator includes a power sensor (not shown) that is coupled to the RF cable 134 and to the DSP 130. The power sensor measures power that is supplied by the x MHz RF generator for different values of measurement of voltage that is sensed by the probe 124. The measurement of power is provided by the power sensor via the DSP 130 to the host system 128 by the power sensor. Based on the measurement of voltage that is sensed by the probe 124 and the measurement of supplied power received from the power sensor, the host system 128 determines an amount of power to be supplied to achieve a voltage of plasma within the plasma chamber 122.

A value of power that is determined by the processor of the host system 128 is provided to the DSP 130, which provides the power value to the DAS 132. The DAS 132 generates an RF signal having the power value and the RF signal is supplied via the RF cable 134, the matchbox 136, and the RF transmission line 140 to the lower electrode of the ESC 126 to achieve the peak magnitude W0mag of the fundamental waveform W0.

In several embodiments, a peak magnitude of a combined waveform is increased by the processor of the host system 128 to match the peak magnitude W0mag of the fundamental waveform W0.

In various embodiments, the processor of the host system 128 determines the phase difference φW5W0 between the phase φW5 of the combined waveform W5 and the phase φW0 of the fundamental waveform W0.

In some embodiments, a user changes one or more elements of the plasma system 120 to reduce the phase difference φW5W0. For example, a user replaces one or more of the RF cable 134, the matchbox 136, the RF cable 142, RF tunnel 144, and the RF strap 148 to eliminate the phase difference φW5W0. In this example, the user replaces the RF cable 134 with another RF cable, replaces the matchbox 136 with another matchbox, replaces the RF cable 142 with another RF cable, replaces the RF tunnel 144 with another RF tunnel, and/or replaces the RF strap 148 with another RF strap. As another example, a user tweaks spacing between capacitor plates of a capacitor within the matchbox 136 to eliminate the phase difference φW5W0.

In some embodiments, the user replaces an element with another element that has similar characteristics, e.g., inductance, capacitance, resistance, a combination thereof, etc., as that of the element that is replaced. For example, the RF cable that replaced the RF cable 134 has the same resistance as that of the RF cable 134. As another example, the matchbox that replaces the matchbox 136 has the same capacitance as that of the matchbox 136.

In several embodiments, the processor of the host system 128 is notified by a user of a change to one or more elements of the plasma system 120. For example, the user indicates to the processor via an input device that one or more of the RF cable 134, the matchbox 136, the RF cable 142, RF tunnel 144, and the RF strap 148 is replaced. As another example, the user indicates via the input device to the processor of the host system 128 that spacing between capacitor plates of a capacitor within the matchbox 136.

Examples of an input device include a keyboard, a mouse, a stylus, a trackball, etc. The input device is coupled to the processor of the host system 128.

After the one or more elements of the plasma system 120 are changed, RF power is supplied from the x MHz RF generator to the plasma chamber 122 via the RF cable 134, the matchbox 136, and the RF transmission line 140 to strike plasma within the plasma chamber 122. Moreover, the processor of the host system 128 receives a measurement of voltage from the probe 124 and generates a combined waveform from the measurement as a function of time. When the processor of the host system 128 determines that combined waveform generated from the measurement has the same phase as that of the fundamental waveform W0, the user decides not to further change elements of the plasma system 120. Otherwise, when the processor of the host system 128 determines that combined waveform generated from the measurement has a different phase from that of the fundamental waveform W0, the user decides to further change elements of the plasma system 120.

Figure 3A:
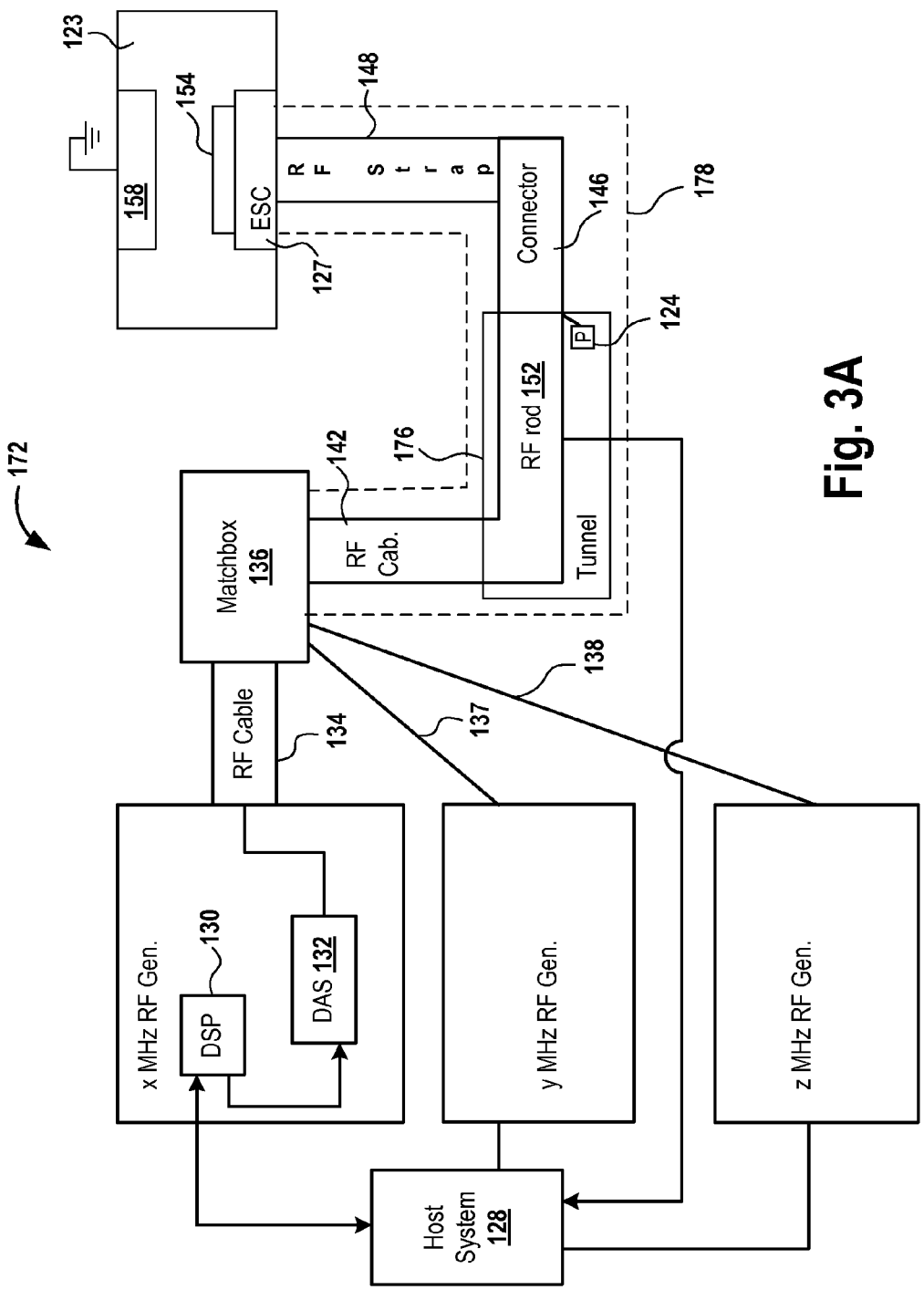
FIG. 3A is a block diagram of an embodiment of a plasma system for generating voltage waveforms of voltage of plasma within a plasma chamber by using a probe within an RF tunnel and using a computer-generated model, in accordance with a number of embodiments described in the present disclosure.

FIG. 3A is a block diagram of an embodiment of a plasma system 172 for generating voltage waveforms based on voltage of plasma within a plasma chamber 123 by using the probe 124 within an RF tunnel 176. The plasma chamber 123 is an example of the plasma chamber 1, which is described above. The plasma system 172 operates in a similar manner as that of the plasma system 120 (FIG. 2) except that the plasma chamber 123 excludes the probe 124 within the ESC 126. Instead, the plasma system 172 includes the probe 124 within an insulator of the RF tunnel 176. The probe 124 is coupled to an output of the RF rod 152.

The output of the RF rod 152 is coupled to an input of the RF strap 148 via the connector 146. An input of the RF rod 152 is coupled to an output of the RF cable 142. An input of the RF cable 142 is coupled to the matchbox 136. An output of the RF strap 148 is coupled to a lower electrode of an ESC 127 of a plasma chamber 123. The ESC 127 is similar in structure and function to the ESC 126 (FIG. 3) except that the ESC 127 excludes the probe 124 (FIG. 3).

In some embodiments, the probe 124 is coupled to the RF rod 152 and is located outside the RF tunnel 176.

The RF cable 142, the RF rod 152, the RF tunnel 176, the connector 146, and the RF strap 148 are elements of an RF transmission line 178 that couple the matchbox 136 to the lower electrode of the ESC 127.

The probe 124 measures the voltage of plasma within the plasma chamber 123 when the x MHz RF generator supplies power to the plasma chamber 122. The power is supplied to the plasma chamber 123 via the RF cable 134, the matchbox 136, and the RF transmission line 178.

A measurement of the voltage is sent by the probe 124 to the host system 128. Upon receiving the measurement of the voltage, the analog-to-digital converter of the host system 128 converts the measurement from an analog form to a digital form and provides the digital measurement to the processor of the host system 128. The processor of the host system 128 applies a computer-generated model of one or more portions of the RF transmission line 178 and/or of the ESC 127 to the digital measurement to determine the voltage at the ESC 127. The computer-generated model is described below.

In some embodiments, instead of performing the conversion from the analog to the digital format within the host system 128, the probe 124 converts the analog measurement of the voltage to the digital format and sends the digital measurement to the processor of the host system 128.

Figure 3B:
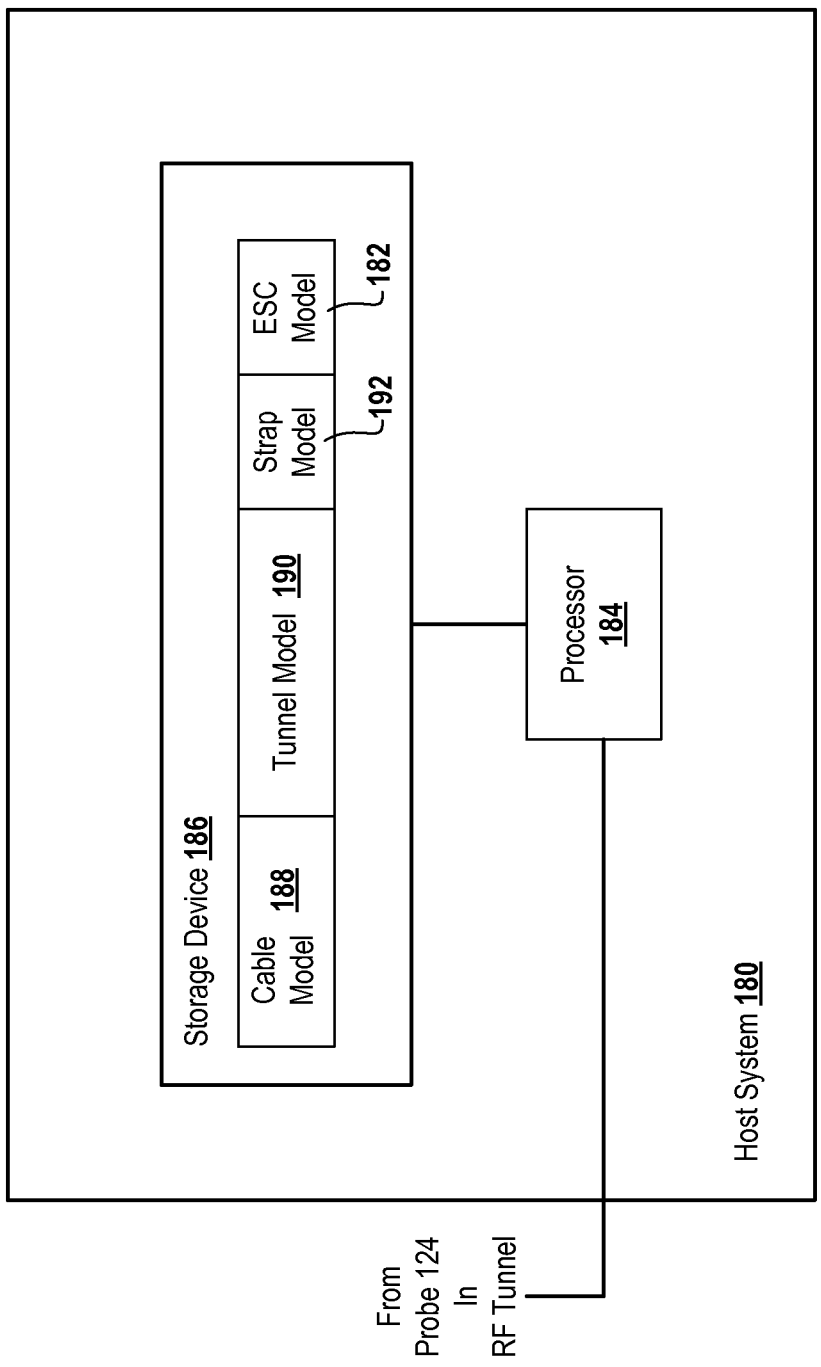
FIG. 3B is a block diagram of an embodiment of a host system for using the computer-generated model to determine a value of a voltage at an ESC model, in accordance with an embodiment described in the present disclosure.

FIG. 3B is a block diagram of an embodiment of a host system 180 for using a computer-generated model to determine a value of a voltage at an ESC model 182. The host system 180 includes a processor 184 and a storage device 186. The storage device 186 may be a hard disk, a flash memory, a disk array, etc. The host system 180 is an example of the host system 128 (FIG. 2). The storage device 186 is coupled to the processor 184 and stores a cable model 188, a tunnel model 190, a strap model 192, and the ESC model 182.

It should be noted that the cable model 187 is a computer-generated model of the RF cable 142 (FIG. 3A), the tunnel model 190 is a computer-generated model of the RF tunnel 176 (FIG. 3A), the strap model 192 is a computer-generated model of the RF strap 148 (FIG. 3A), and the ESC model 182 is a computer-generated model of the ESC 127 (FIG. 3A). For example, the tunnel model 190 has similar characteristics, e.g., capacitances, inductances, complex power, complex voltage and currents, etc., as that of the RF rod 152. To further illustrate, the tunnel model 190 has the same capacitance, inductance, resistance, or a combination thereof as that of the RF rod 152. As another example, the strap model 192 has the same capacitance, inductance, resistance, or a combination thereof as that of the RF strap 148. As yet another example, the ESC model 182 has the same capacitance, inductance, resistance, or a combination thereof as that of the ESC 127.

The processor 184 receives a measurement of the voltage from the probe 124 (FIG. 3A). The processor 184 determines a value of the variable at an output of the ESC model 182 based on the measurement of the voltage received from the probe 124 and the characteristics of the strap model 192 and the ESC model 182. For example, the processor 184 receives the current at the output of the RF rod 152 (FIG. 3A), receives a magnitude of the voltage at the output of the RF rod 152, receives a phase of the voltage, and determines a directed sum of the voltage, and voltages generated by the capacitances, inductances, and/or resistances of the strap model 192 and the ESC model 182 to determine voltage and current at the output of the ESC model 182.

The processor 184 uses the voltage at the output of the ESC model 182 instead of the measurement of the voltage from the probe 124 to determine waveforms of voltages of plasma within the plasma chamber 123 (FIG. 3A).

In various embodiments, the probe 124 is connected to an input of the RF rod 152 instead of to the output of the RF rod 152. In these embodiments, the processor 184 determines a voltage at an output of the ESC model 182 based on the measurement of the voltage received from the probe 124 and the characteristics of the tunnel model 190, the strap model 192 and the ESC model 182.

In some embodiments, instead of using the ESC model 182 in addition to the strap model 192, the processor 184 uses the strap model 192 to determine the voltage at the output of the strap model 192 and uses the voltage to determine waveforms of voltage of plasma within the plasma chamber 123 (FIG. 3A). For example, the processor 184 determines a voltage at an output of the strap model 192 based on the measurement of the voltage received from the probe 124 and the characteristics of the strap model 192.

In various embodiments, the probe 124 is coupled to any point between the x MHz RF generator and the wafer 154 (FIG. 3A). For example, the probe 124 is coupled to the RF cable 134. In these embodiments, a computer-generated model of elements of the plasma system 172 between the point and the wafer 154 is generated and voltage at a computer-generated model of the ESC 127 is determined based on the voltage measured with the probe 124 and impedances of elements between the point and the wafer 154. For example, when the probe 124 is coupled to a point on the RF cable 134, a computer-generated model of elements of the plasma system 172 between a portion of the RF cable 134 from the point to the matchbox 136, the matchbox 136, the RF cable 142, the RF rod 152, the RF strap 148, and the ESC 127 is generated. In this example, a voltage at the ESC model 182 is determined based on the voltage measured at the point and impedances of a computer-generated model of the portion of the RF cable 134, a computer-generated model of the matchbox 136, the cable model 188, the tunnel model 190, the strap model 192, and the ESC model 182. As another example, when the probe 124 is coupled to an output of the x MHz RF generator, a computer-generated model of the RF cable 134, the matchbox 136, the RF transmission line 140, and the ESC 127 is generated. The output of the x MHz RF generator is coupled to an input of the RF cable 134. In this example, voltage at the output of the x MHz RF generator is measured and voltage at the wafer 154 is determined based on the measured voltage and impedances of elements, e.g., resistors, capacitors, inductors, etc., of the RF cable 134, the matchbox 136, the RF transmission line 140, and the ESC 127.

In various embodiments, the ESC model 182 is not used to determine a voltage at the ESC 127 (FIG. 3A). For example, when the probe 124 is coupled to a point on the RF cable 134, a computer-generated model of elements of the plasma system 172 between a portion of the RF cable 134 from the point to the matchbox 136, a computer-generated model of the matchbox 136, the cable model 188, the tunnel model 190, and the strap model 192 are generated. In this example, a voltage at the ESC model 182 is determined based on the voltage measured at the point and impedances of the computer-generated model of the portion of the RF cable 134, the computer-generated model of the matchbox 136, the cable model 188, the tunnel model 190, and the strap model 192.

Figure 4:
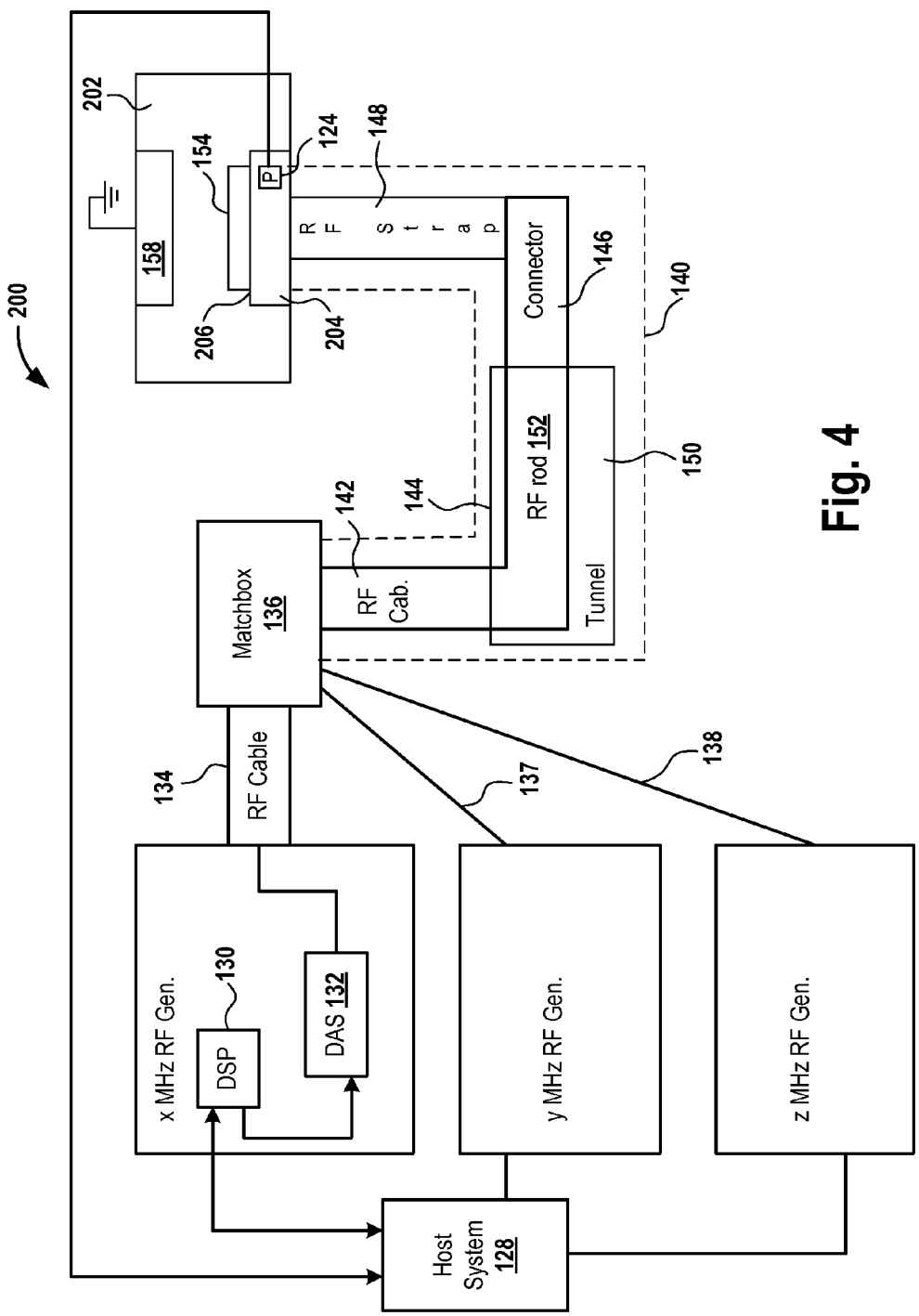
FIG. 4 is a block diagram of an embodiment of a plasma system for illustrating chamber-to-chamber matching between a plasma chamber of the plasma system of FIG. 2 and another plasma chamber, in accordance with an embodiment described in the present disclosure.

FIG. 4 is a block diagram of an embodiment of a plasma system 200 for illustrating chamber-to-chamber matching between the plasma chamber 122 (FIG. 2) and a plasma chamber 202. The system 200 is similar to the system 120 (FIG. 2) except that the system 200 includes a plasma chamber 202 instead of the plasma chamber 122. For example, the plasma chamber 202 has a different identification code than the plasma chamber 122 and both the plasma chambers 202 and 122 have the same structure and/or function. As another example, one or more elements of the plasma chamber 122 are replaced with one or more elements of the same structure and/or function as that of the replaced elements to manufacture the plasma chamber 202. As yet another example, the ESC 204 replaces the ESC 126 (FIG. 2) of the plasma chamber 122 to manufacture the plasma chamber 202.

In some embodiments, the one or more elements of the plasma chamber 202 that replace the one or more elements of the plasma chamber 122 have the same structure and/or function as that of the one or more elements of the plasma chamber 122. For example, the ESC 204 has the same dimensions as that of the ESC 126. As another example, the ESC 204 includes the same elements, e.g., a heater, a thermal insulator, a ceramic support, etc., as that of the ESC 126. As yet another example, the ESC 204 has the same characteristics, e.g., inductance, capacitance, resistance, a combination thereof, etc., as that of the ESC 126. As another example, both the plasma chambers 202 and 122 are of the same type.

In various embodiments, the plasma chamber 202 is structurally identical to plasma chamber 122 and has a different identification code than that of the plasma chamber 122. For example, an entity identifies the plasma chamber 202 using an identity code aaaa and the entity identifies the plasma chamber 122 using an identity code bbbb.

In a number of embodiments, the plasma chamber 202 is structurally identical to the plasma chamber 122 and is used to perform the same function as that of the plasma chamber 122.

In various embodiments, the plasma chamber 202 is structurally and functionally identical to plasma chamber 122 and has a different identification code than that of the plasma chamber 122.

In some embodiments, the plasma chamber 122 is an example of the plasma chamber 1 and the plasma chamber 202 is an example of the plasma chamber 2.

In some embodiments, the plasma chamber 122 is decoupled from the RF transmission line 140 to couple the plasma chamber 202 to the RF transmission line 140. In these embodiments, an indication is provided by the user via the input device to the processor of the host system 128 that the plasma chamber 122 is replaced with the plasma chamber 202. The wafer 154 is placed on an upper surface 206 of the ESC 204. The upper surface 206 faces the upper electrode 158.

The probe 124 is embedded within the ESC 204 in a manner similar to that of embedding the probe 124 within the ESC 126. In several embodiments, instead of embedding the probe 124 within the ESC 204, the probe 124 is coupled to the ESC 204 and is located outside the ESC 204.

An RF signal is supplied by the x MHz RF generator via the RF cable 134, the matchbox 136, and the RF transmission line 140 to the lower electrode of the ESC 204. When the process gas is supplied in the plasma chamber 202 and power is supplied to the lower electrode of the ESC 204 via the RF signal, plasma is generated within the plasma chamber 202.

The probe 124 measures voltage of the plasma within the plasma chamber 202 and sends the measurement to the host system 128. In some embodiments, the probe 124 measures the voltage that is proximate to the upper surface 206 of the ESC 204. For example, the plasma is stricken proximate to the ESC 204. As another example, the plasma is generated on top of the upper surface 206. As another example, when the wafer 154 is placed on the upper surface 206 and the upper surface 206 is covered by the wafer 154, the plasma is stricken on top of the wafer 154. As yet another example, when the wafer 154 is placed on the upper surface 206 and a portion of the upper surface 206 is not covered by the wafer 154, plasma is generated on top of the wafer 154 and on top of the portion of the upper surface 206.

The host system 128 generates a combined waveform from the measurement. For example, the host system 128 generates the combined waveform W5 from the measurement received from the probe 124 within the ESC 204. In some embodiments, a measurement of voltage of plasma received over a period of time is a combined waveform.

The processor of the host system 128 determines a difference in the peak magnitude W0mag of the fundamental waveform W0 and the peak magnitude W5mag of the combined waveform W5. When the plasma chamber 122 is the golden chamber and the combined waveform W3 is generated using the plasma chamber 122 (FIG. 2), power supplied by the x MHz RF generator to the plasma chamber 202 is controlled by the processor of the host system 128 to change the peak magnitude W5mag of the combined waveform W5 to match the peak magnitude W0mag of the fundamental waveform W0 that is extracted from the combined waveform W3. The combined waveform W3 is generated from the measurement of the probe 124 within the ESC 126 (FIG. 2).

In various embodiments, instead of a match between a peak magnitude of a combined waveform and a fundamental waveform, a substantial match between the peak magnitudes is achieved. For example, the processor of the host system 128 determines whether the peak magnitude of the combined waveform is within a threshold of the peak magnitude of the fundamental waveform. Upon determining that the peak magnitude of the combined waveform is within the threshold of the peak magnitude of the fundamental waveform, it is determined by the processor of the host system 128 that the peak magnitudes substantially match each other. On the other hand, upon determining that the peak magnitude of the combined waveform is not within the threshold of the peak magnitude of the fundamental waveform, it is determined by the processor of the host system 128 that the peak magnitudes do not substantially match each other. Examples of the threshold include a voltage between zero and five. Other examples of the threshold include a voltage between zero and six.

The power supplied by the x MHz RF generator to the plasma chamber 202 is changed to change the peak magnitude W5mag of the combined waveform W5 to match the peak magnitude W0mag of the fundamental waveform W0 in a manner similar to that described above. For example, the processor of the host system 128 access a database within a storage device of the host system 128 to determine an amount of power to be supplied by the x MHz RF generator to achieve the peak magnitude W0mag. As another example, the processor of the host system 128 controls the DSP 132, which further controls the DAS 132 to supply the amount of power via the RF cable 134 and the RF transmission line 140 to the lower electrode of the ESC 204.

In some embodiments, one or more elements between the x MHz RF generator of the plasma system 200 and the wafer 154 are modified to facilitate matching of the phase of the combined waveform W5 with that of the phase of the fundamental waveform W0. For example, one or more of the RF cable 134, the matchbox 136, the RF cable 142, the RF rod 152, and the RF strap 148 are replaced with a corresponding one or more of an RF cable, a matchbox, an RF cable, an RF rod, and an RF strap to reduce the phase difference $\phi W5W0$. As another example, one or more elements of the matchbox 136 are changed to reduce the phase difference $\phi W5W0$. As yet another example, the RF transmission line 140 is replaced with another RF transmission line that has the same structure as that of the RF transmission line 140 and has a different identification code than the RF transmission line 140.

In several embodiments, the one or more elements that replace the one or more elements of the plasma system 200 have similar characteristics as that of the one or more elements of the plasma system 200. For example, a matchbox that replaces the matchbox 136 has the same inductance, capacitance, or a combination thereof, as that of the matchbox 136. As another example, the RF transmission line that replaces the RF transmission line 140 has the same resistance, inductance, capacitance, or a combination thereof as that of the RF transmission line 140.

In some embodiments, instead of using the probe 124 within the ESC 204, the probe 124 is embedded within the RF tunnel 144 or is coupled to the RF rod 152 to measure voltage at the RF rod 152. A computer-generated model of the RF rod 152, the RF strap 148, and the ESC 204 is used to determine voltage at the ESC 204. The voltage at the ESC 204 is determined based on the voltage measured using the probe 124 that is embedded within the RF tunnel 144 and impedance of elements of the RF rod 152, the RF strap 148, and the ESC 204. In several embodiments, instead of using a computer-generated model of the ESC 204, voltage at the ESC 204 is determined based on a computer-generated model of the RF rod 152 and the RF strap 148 and based on the voltage measured using the probe 124 that is embedded within the RF tunnel 144.

In some embodiments, the probe 124 is coupled to a point between the x MHz RF generator and the wafer 154 and a computer-generated model of elements between the point and the plasma chamber 204 is used to determine a voltage at the ESC 204. For example, the probe 124 is coupled to the RF cable 134 to determine voltage at the RF cable 134. Moreover, a computer-generated model of the matchbox 136, the RF transmission line 140, and the ESC 204 is used to determine a voltage at the ESC 204. As another example, the probe 124 is coupled to the RF cable 134 to determine voltage at the RF cable 134. Moreover, a computer-generated model of the matchbox 136 and the RF transmission line 140 is used to determine a voltage at the ESC 204.

It should be noted that in several embodiments, when the x MHz RF generator of the system 200 is used to supply power to the plasma chamber 202 to determine a combined waveform, the y and z MHz RF generators are turned off. Similarly, when the y MHz RF generator of the system 200 is used to supply power to the plasma chamber 202 to determine a combined waveform, the x and z MHz RF generators are turned off. Also, when the z MHz RF generator of the system 200 is used to supply power to the plasma chamber 202 to determine a combined waveform, the y and z MHz RF generators are turned off.

In several embodiments, the processor of the host system 128 is notified by a user of a change to one or more elements of the plasma system 200. For example, the user indicates to the processor via the input device that one or more of the RF cable 134, the matchbox 136, the RF cable 142, RF tunnel 144, and the RF strap 148 is replaced. As another example, the user indicates via the input device to the processor of the host system 128 that spacing between capacitor plates of a capacitor within the matchbox 136.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an ICP reactor, a TCP reactor, a conductor tool, a dielectric tool, a plasma chamber including an ECR reactor, etc. For example, the x MHz RF generator and the y MHz RF generator are coupled to an inductor within the ICP plasma chamber.

It is also noted that although the operations above are described as being performed by the processor of the host system 128 (FIGS. 2, 3A, and 4), in some embodiments, the operations may be performed by one or more processors of the host system 128 or by multiple processors of multiple host systems.

It should be noted that although the above-described embodiments relate to providing an RF signal to a lower electrode of an ESC and grounding the upper electrode 158 (FIGS. 2, 3A, and 4), in several embodiments, the RF signal is provided to the upper electrode 158 while the lower electrode is grounded.

It is also noted that although the above-described embodiments are described using an ESC, another type of chuck, e.g., a magnetic chuck, etc., may be used.

It is further noted that in several embodiments, the operations described above as performed by the processor of the host system 128 may be performed by the DSP 130 (FIGS. 2, 3A, and 4).

Embodiments described herein may be practiced with various computer system configurations including hand-held hardware units, microprocessor systems, microprocessor-based or programmable consumer electronics, minicomputers, mainframe computers and the like. The embodiments may also be practiced in distributed computing environments where tasks are performed by remote processing hardware units that are linked through a network.

With the above embodiments in mind, it should be understood that the embodiments may employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for compensating for harmonics produced during plasma processing in a plasma chamber, the method comprising:
    retrieving a measurement of a combined waveform, the combined waveform including a fundamental waveform and a harmonic waveform, the combined waveform defining a voltage proximate to a surface of a chuck, the chuck coupled to a radio frequency (RF) transmission line, the RF transmission line coupled to an impedance matching circuit, the impedance matching circuit coupled to an RF generator;
    extracting the fundamental waveform from the combined waveform;
    determining a difference between a magnitude of the combined waveform and a magnitude of the fundamental waveform; and
    controlling the RF generator to compensate for the difference,
    wherein the method is executed by one or more processors.

2. The method of claim 1, wherein controlling the RF generator comprises changing power supplied by the RF generator so that the magnitude of the combined waveform substantially matches the magnitude of the fundamental waveform.

3. The method of claim 2, wherein the magnitude of the combined waveform substantially matches the magnitude of the fundamental waveform when the magnitude of the combined waveform is within a threshold of the magnitude of the fundamental waveform.

4. The method of claim 1, wherein the magnitude of the combined waveform is a maximum magnitude of the combined waveform and the magnitude of the fundamental waveform is a maximum magnitude of the fundamental waveform.

5. The method of claim 4, wherein the maximum magnitude is a peak magnitude.

6. The method of claim 1, wherein the voltage is present on top of the surface of the chuck.

7. The method of claim 1, wherein the measurement includes a measurement of a voltage.

8. The method of claim 1, wherein extracting the fundamental waveform from the combined waveform comprises:
  filtering in multiple ranges of frequencies, wherein each range extends from a pre-determined frequency;
  determining a lowest one of the frequency ranges at which a waveform is output by the filtering; and
  determining the lowest frequency range to include a frequency of the fundamental waveform.

9. The method of claim 1, wherein the measurement is made by a probe coupled to the chuck.

10. The method of claim 1, further comprising determining the measurement based on a measurement at a point between the RF generator and the chuck and based on a computer-generated model of elements between the point and the chuck.

11. The method of claim 10, wherein the elements include:
  at least a portion of an RF strap of the RF transmission line, the RF strap coupled to the chuck;
  at least a portion of an RF tunnel of the RF transmission line, the RF tunnel coupled to the RF strap;
  at least a portion of an RF cable of the RF transmission line, the RF cable coupled to the RF tunnel and the impedance matching circuit;
  at least a portion of the impedance matching circuit;
  at least a portion of an RF cable coupling the impedance matching circuit to the RF generator; or
  a combination thereof.

12. The method of claim 1, wherein retrieving the measurement comprises reading the measurement from a storage device.

13. A method for compensating for harmonics produced during plasma processing in a plasma chamber, the method comprising:
  retrieving a measurement of a combined waveform, the combined waveform including a fundamental waveform and a harmonic waveform, the combined waveform defining a variable proximate to a surface of a chuck, the chuck coupled to a radio frequency (RF) transmission line, the RF transmission line coupled to an impedance matching circuit, the impedance matching circuit coupled to an RF generator;
  extracting the fundamental waveform from the combined waveform;
  determining a difference between a phase of the combined waveform and a phase of the fundamental waveform; and
  receiving an indication of a change to a plasma system, the change made to compensate for the difference, the plasma system including the RF transmission line, an RF cable coupling the impedance matching circuit to the RF generator, the impedance matching circuit, or a combination thereof,
  wherein the method is executed by one or more processors.

14. The method of claim 13, wherein the change to the plasma system comprises:
  a replacement of the RF transmission line with another RF transmission line;
  a replacement of the RF cable with another RF cable;
  a replacement of the impedance matching circuit with another matching circuit; or
  a combination thereof.

15. A method for performing chamber-to-chamber matching, the method comprising:
  retrieving a measurement of a combined waveform, the combined waveform including a fundamental waveform and a harmonic waveform, the combined waveform defining a voltage proximate to a surface of a chuck, the chuck coupled to a radio frequency (RF) transmission line, the RF transmission line coupled to an impedance matching circuit, the impedance matching circuit coupled to an RF generator;
  extracting the fundamental waveform from the combined waveform;
  receiving an indication of coupling another chuck to the RF transmission line;
  retrieving a measurement of another combined waveform, the other combined waveform defining a voltage proximate to a surface of the other chuck;
  determining a difference between a magnitude of the other combined waveform and a magnitude of the fundamental waveform; and
  controlling the RF generator to compensate for the difference,
  wherein the method is executed by one or more processors.

16. The method of claim 15, wherein the chuck is located within a plasma chamber, the other chuck is located with another plasma chamber, wherein the plasma chamber provides a higher yield than the other plasma chamber.

17. A method for performing chamber-to-chamber matching, the method comprising:
  retrieving a measurement of a combined waveform, the combined waveform including a fundamental waveform and a harmonic waveform, the combined waveform defining a voltage proximate to a surface of a chuck, the chuck coupled to a radio frequency (RF) transmission line, the RF transmission line coupled to an impedance matching circuit, the impedance matching circuit coupled to an RF generator;
  extracting the fundamental waveform from the combined waveform;
  receiving an indication of coupling another chuck to the RF transmission line;
  retrieving a measurement of another combined waveform, the other combined waveform defining a voltage proximate to a surface of the other chuck;
  determining a difference between a phase of the other combined waveform and a phase of the fundamental waveform; and
  receiving an indication of a change to a plasma system, the change made to compensate for the difference, the plasma system including the RF transmission line, an RF cable coupling the impedance matching circuit to the RF generator, the impedance matching circuit, the other chuck, or a combination thereof, wherein the method is executed by one or more processors.

18. The method of claim 17, wherein the chuck is located within a plasma chamber, the other chuck is located with another plasma chamber, wherein the plasma chamber provides a higher yield than the other plasma chamber.

19. A method for performing intra-chamber matching, the method comprising:

retrieving a measurement of a combined waveform, the combined waveform including a fundamental waveform and a harmonic waveform, the combined waveform defining a voltage proximate to a surface of a chuck of a plasma chamber in a first condition, the chuck coupled to a radio frequency (RF) transmission line, the RF transmission line coupled to an impedance matching circuit, the impedance matching circuit coupled to an RF generator;

extracting the fundamental waveform from the combined waveform;

receiving an indication of a change in the plasma chamber from the first condition to a second condition;

retrieving a measurement of another combined waveform generated within the plasma chamber, the other combined waveform generated when the plasma chamber is in the second condition;

determining a difference between a magnitude of the other combined waveform and a magnitude of the fundamental waveform; and controlling the RF generator to compensate for the difference, wherein the method is executed by one or more processors.

20. The method of claim 19, wherein the second condition occurs after occurrence of the first condition.

21. The method of claim 19, wherein the second condition occurs after using the plasma chamber for processing a wafer.

22. A method for performing intra-chamber matching, the method comprising:

retrieving a measurement of a combined waveform, the combined waveform including a fundamental waveform and a harmonic waveform, the combined waveform defining a voltage proximate to a surface of a chuck of a plasma chamber in a first condition, the chuck coupled to a radio frequency (RF) transmission line, the RF transmission line coupled to an impedance matching circuit, the impedance matching circuit coupled to an RF generator;

extracting the fundamental waveform from the combined waveform;

receiving an indication of a change the plasma chamber from the first condition to a second condition;

retrieving a measurement of another combined waveform, the other combined waveform generated when the plasma chamber is in the second condition;

determining a difference between a phase of the other combined waveform and a phase of the fundamental waveform; and receiving an indication of a change to a plasma system, the change made to compensate for the difference, the plasma system including the RF transmission line, an RF cable coupling the impedance matching circuit to the RF generator, the impedance matching circuit, the chuck, or a combination thereof, wherein the method is executed by one or more processors.

23. The method of claim 22, wherein the second condition occurs after using the plasma chamber for processing a wafer.

* * * * *